United States Patent
Ardalan (10) Patent No.: US 9,912,323 B1
(45) Date of Patent: Mar. 6, 2018

(54) RADIATION HARDENED STRUCTURED ASIC PLATFORM WITH COMPENSATION OF DELAY FOR TEMPERATURE AND VOLTAGE VARIATIONS FOR MULTIPLE REDUNDANT TEMPORAL VOTING LATCH TECHNOLOGY

(71) Applicant: Micro RDC, Colorado Springs, CO (US)

(72) Inventor: Sasan Ardalan, Alberquerque, NM (US)

(73) Assignee: MICRO RESEARCH & DEVELOPMENT CORPORATION, Colorado Springs, CO (US)

( * ) Notice: Subject to any disclaimer, the term of this patent is extended or adjusted under 35 U.S.C. 154(b) by 0 days.

(21) Appl. No.: 14/862,140

(22) Filed: Sep. 22, 2015

(51) Int. Cl.
| | |
|---|---|
| H03K 3/289 | (2006.01) |
| H03K 3/037 | (2006.01) |
| H03K 19/003 | (2006.01) |
| H03K 5/135 | (2006.01) |
| H03K 5/00 | (2006.01) |

(52) U.S. Cl.
CPC ......... *H03K 3/0375* (2013.01); *H03K 3/0372* (2013.01); *H03K 5/135* (2013.01); *H03K 19/00338* (2013.01); *H03K 2005/00013* (2013.01)

(58) Field of Classification Search
None
See application file for complete search history.

(56) References Cited

U.S. PATENT DOCUMENTS

| | | | |
|---|---|---|---|
| 6,127,864 A * | 10/2000 | Mavis | H03K 3/0375 327/144 |
| 2007/0063749 A1* | 3/2007 | Fan | H03K 5/133 327/158 |
| 2007/0285144 A1* | 12/2007 | Bhowmik | H03H 11/265 327/261 |
| 2012/0126869 A1* | 5/2012 | Payne | H03L 7/0812 327/161 |

* cited by examiner

*Primary Examiner* — Cassandra Cox
(74) *Attorney, Agent, or Firm* — Juneau & Mitchell; Todd L. Juneau (57) ABSTRACT

The invention relates to devices and methods of maintaining the current starved delay at a constant value across variations in voltage and temperature to increase the speed of operation of the sequential logic in the radiation hardened ASIC design.

12 Claims, 8 Drawing Sheets

FIGURE 8

RADIATION HARDENED STRUCTURED ASIC PLATFORM WITH COMPENSATION OF DELAY FOR TEMPERATURE AND VOLTAGE VARIATIONS FOR MULTIPLE REDUNDANT TEMPORAL VOTING LATCH TECHNOLOGY

FEDERALLY SPONSORED RESEARCH OR DEVELOPMENT

This invention was made with U.S. government support under NASA contract number NNX14CG51P. The U.S. government has certain rights in the invention.

JOINT RESEARCH AGREEMENT n/a

SEQUENCE LISTING n/a

TECHNICAL FIELD

This invention relates to integrated circuits, and particularly to radiation hardened application specific integrated circuits that use a temporal latch technique and compensate for worst case temperature and voltage using a bias current source.

BACKGROUND

Space-based circuitry has required radiation hardening due to the interference of cosmic rays and solar radiation with the pn junctions of the device. Cosmic rays are composed 90% of protons and 9% alpha particles. Cosmic rays can have an energy range from $0.3 \times 10^9$ eV to $3.0 \times 10^{20}$ eV. The solar wind is composed 95% of protons and electrons travelling at 400-650 km/sec. Solar flares, or coronal mass ejections (CMEs), can impact circuits with even higher energy protons and heavy ions by causing the collection of charge in p-n junctions.

High-energy protons and heavy ions lose energy in materials mainly through ionization processes. When this occurs, they leave a dense trail of electron-hole pairs as they pass through a p-n junction. Some of the resulting charge will recombine, and some will be collected at the junction contacts. In addition to the charge provided by depleted junction, indirect charge can be added from regions outside the junction due to charge funneling and diffusion. This accumulation of charge results in a very short duration pulse of current at the internal circuit node which is struck by the particle. The magnitude of the charge depends on the energy, type, and charge of the ion, the path length, and the size and sensitivity of the circuit to small current impulses, including the voltage required to switch states.

Most of the charge deposited at the circuit node occurs in time periods of about 200 picoseconds (ps), and this is known as prompt charge. There is also delayed charge as a result of diffusion which occurs in time periods of about 1 microsecond (μs) or longer. This delayed charge is the cause of dynamic memory upset and latchup. Transient effects, such as single-event upset (SEU) and multiple-bit upset (MBU) change the state of internal storage elements, but can be reset to normal operation by a simple series of electrical operations or reinitialization. Catastrophic events, such as single-event latchup (SEL) and snapback, are capable of causing physical destruction of the circuit node unless they are corrected for within a short time after they occur.

Single-event upsets that occur in storage elements are capable of changing the state of the circuit, and stored information is lost. However, the circuit still functions normally, and it can be restored to its original operating state by rewriting or reinitializing the circuit. More catastrophic damage such as latchup, where a transient accidentally creates a low resistance short-circuit parasitic path across a circuit, can lead to permanent heat damage to the silicon and can cause a chain reaction of latchup in nearby circuits. Although earth-bound CMOS circuit designs use special guardbands and clamp circuits at input/output terminals to prevent latchup, in a radiation environment like space the heavy ion or proton strikes generate enough current to trigger latchup in internal region of a CMOS device, as well as in I/O circuitry. Historically, the only way to save a circuit from latchup was to sense the excess current and immediately power down and restart the system.

As circuits continue to shrink in size and power requirements decrease, susceptibility to SEUs and to latchup is increased.

SUMMARY

The present invention provides in one preferred embodiment, an ASIC that has (data latch) circuit structure includes two delay elements, the first delay element is set to DT (a time delay) while the second delay element is set to 2*DT, where a voter circuit votes between the original signal, the signal delayed by DT and the signal delayed by 2*DT, providing filtering of transients due to multiple node strikes resulting in SEU immunity, wherein the delay may be implemented using a current starved delay circuit, in this circuit the delay can be controlled by a control voltage. As the voltage is increased the delay decreases. The delay is dependent on supply voltage and temperature. Therefore, the delay varies over voltage and temperature and due to process variations.

The delay DT is chosen based on a particular technology node. For example at 90 nm Bulk CMOS it may be a few nanoseconds. At 45 nm SOI CMOS it is less than 200 picoseconds.

In preferred embodiments, there is specifically provided an integrated circuit device comprising: a current starved delay circuit to control voltage supplied to multiple sampling systems; the multiple sampling systems sample input data at different times, wherein periods between the different times exceed a duration of a pulse width of a single event upset; a vote timing system coupled to collect samples from the sampling systems at another time; and a majority system to select a majority of the samples gathered by the vote timing system; wherein an increase in the control voltage decreases the periods between the different times, and a decrease in the control voltage increases the periods between the different times.

In another preferred embodiment, there is specifically provided the integrated circuit device having one or more of the following aspects, including wherein each of the sampling systems comprises a latch, and/or an aspect wherein each of the sampling systems comprises a dual interlocked storage cell that cannot be upset with a single node strike, and/or an aspect wherein each of the sampling systems comprises a D flip-flop.

In another preferred embodiment, there is specifically provided the integrated circuit device, wherein the sampling systems comprise: a first sampling system that samples the input data at a first time; a second sampling system that samples the input data at a second time after the first time; and a third sampling system that samples the input data at a third time after the first and second times.

In another preferred embodiment, there is specifically provided the integrated circuit device further comprising clock generating circuitry to derive three clock signals from a master clock signal, the three clock signals being used to define the first, second, and third times.

In another preferred embodiment, there is specifically provided the integrated circuit device wherein the vote timing system collects the samples at a fourth time different from the first, second, and third times.

In another preferred embodiment, there is specifically provided the integrated circuit device further comprising mode selection circuitry operatively coupled to the multiple sampling systems to drive the multiple sampling systems alternately between (1) a safe mode in which periods between the different times exceed a duration of a pulse width of a single event upset and (2) a fast mode in which the periods between the different times do not exceed a duration of a pulse width of a single event upset.

In yet another preferred embodiment, there is specifically provided a sequential circuit comprising: combinatorial logic; and an integrated circuit device as above coupled to the combinatorial logic.

In another preferred embodiment, there is specifically provided the integrated circuit device as above embodied in a spaceborne microelectronics system, and/or an aspect embodied in a satellite, and/or an aspect embodied in a spacecraft, and/or an aspect in an aircraft control system.

In another preferred embodiment, there is specifically provided the integrated circuit device comprising: a current starved delay circuit to control voltage supply; a clock generating circuit to generate first, second, third, and fourth clock signals from a master clock signal wherein periods between the clock signals exceed a duration of a pulse width of a single event upset; a first sampling circuit triggered by the first clock signal to sample input data at a first time; a second sampling circuit triggered by the second clock signal to sample the input data at a second time; a third sampling circuit triggered by the third clock signal to sample the input data at a third time; and a sample release circuit coupled to the first, second, and third sampling circuits and triggered by the fourth clock signal to output at a fourth time a majority of the samples collected by the first, second, and third sampling circuits; wherein an increase in the control voltage decreases the periods between the clock signals, and a decrease in the control voltage increases the periods between the clock signals.

In another preferred embodiment, there is specifically provided the integrated circuit device having one or more of the following aspects, including wherein the master clock signal has a first frequency and the first, second, third, and fourth clock signals operate at a second frequency that is one-half the first frequency, and/or an aspect wherein the first, second, third, and fourth clock signals are time shifted from one another, and/or an aspect wherein each of the first, second, third, and fourth clock have a width greater than 200 ps, and/or an aspect wherein the clock generating circuit comprises a latch to receive the master clock signal and a decoder to produce the first, second, third, and fourth clock signals from the master clock signal, and/or an aspect wherein each of the sampling circuits comprises a latch, and/or an aspect wherein each of the sampling circuits comprises a dual interlocked storage cell that cannot be upset with a single node strike, and/or an aspect wherein each of the sampling circuits comprises a D flip-flop.

In another preferred embodiment, there is specifically provided the integrated circuit device including wherein the sample release circuit comprises: a vote timing circuitry coupled to receive the samples taken by the first, second, and third sampling circuits at the fourth time; and a majority system to select a majority of the samples received by the vote timing circuitry.

In another preferred embodiment, there is specifically provided the integrated circuit device further comprising a mode selection circuit coupled to the clock generating circuit to enable a fast mode of operation in which the first, second, and third sampling circuits and the sample release circuit operate at a frequency of the master clock signal without upset immunity.

In yet another preferred embodiment, there is specifically provided a sequential circuit comprising: combinatorial logic; and an integrated circuit device as above coupled to the combinatorial logic.

In another preferred embodiment, there is specifically provided the integrated circuit device as above embodied in a spaceborne microelectronics system, and/or an aspect embodied in a satellite, and/or an aspect embodied in a spacecraft, and/or an aspect in an aircraft control system.

In another preferred embodiment, there is specifically provided an integrated circuit device, comprising: a current starved delay circuit to control voltage supply; a clock generating circuit having multiple generators, each of which produces a set of first, second, third, and fourth clock signals from a master clock signal and a majority system to select a majority from the sets of clock signals produced by the multiple generators to produce a majority first clock signal, a majority second clock signal, a majority third clock signal, and a majority fourth clock signal; a first sampling circuit triggered by the majority first clock signal to sample input data at a first time; a second sampling circuit triggered by the majority second clock signal to sample the input data at a second time; a third sampling circuit triggered by the majority third clock signal to sample the input data at a third time; and a sample release circuit coupled to the first, second, and third sampling circuits and triggered by the majority fourth clock signal to output at a fourth time a majority of the samples collected by the first, second, and third sampling circuits; wherein an increase in the control voltage decreases the periods between the majority clock signals, and a decrease in the control voltage increases the periods between the majority clock signals.

In another preferred embodiment, there is specifically provided a temporally redundant latch comprising: means for receiving data from circuitry; means for providing an addition-based invariant current source as control voltage; and means for redundantly sampling the data at multiple time-shifted periods, wherein each of the periods exceeds a duration of a pulse width of a single event upset, wherein an increase in the control voltage decreases the periods between the periods, and a decrease in the control voltage increases the periods between the periods.

In another preferred embodiment, there is specifically provided a temporally redundant latch having one or more of the following aspects, including further comprising means for selecting a majority of samples taken from the data, and/or an aspect further comprising means for generating multiple clock signals to effectuate the redundant sampling, and/or an aspect further comprising mode selection means for driving the redundantly sampling means alternately between (1) a safe mode of operation in which the data is sampled at periods which exceed a duration of a pulse width of a single event upset and (2) a fast mode of operation in which the data is sampled at periods which do not exceed the duration of the pulse width of the single event upset.

In another preferred embodiment, there is specifically provided a method for controlling upsets in an integrated circuit device, comprising: providing a current starved delay circuit to control voltage supply; sampling data at multiple different times to produce multiple time-spaced samples that are spaced temporally longer than a pulse width of a single event upset; collecting the time-spaced samples at another time; and selecting a majority from the time-spaced samples; wherein an increase in the control voltage decreases the periods between the different times, and a decrease in the control voltage increases the periods between the different times.

In another preferred embodiment, there is specifically provided a method as recited herein, wherein the different times and said another time are separate from one another.

In another preferred embodiment, there is specifically provided a method as recited herein, further comprising the step of alternatively switching between a safe mode of operation in which data is sampled at multiple different times to produce multiple time-spaced samples that are spaced temporally longer than a pulse width of a single event upset and a fast mode of operation in which the data is sampled at times in which the time-spaced samples are temporally spaced so as not to exceed the pulse width of the single event upset.

In another preferred embodiment, there is specifically provided a method for controlling upsets in an integrated circuit device, comprising the steps of: providing a current starved delay circuit to control voltage supply; generating first, second, third, and fourth clock signals such that time periods between the clock signals exceed a pulse width of a single event upset; sampling data at a first time determined by the first clock signal to produce a first data sample; sampling the data according at a second time determined by the second clock signal to produce a second data sample; sampling the data according at a third time determined by the third clock signal to produce a third data sample; and selecting a majority of the first, second, and third data samples at a fourth time determined by the fourth clock signal; wherein an increase in the control voltage decreases the periods between the clock signals, and a decrease in the control voltage increases the periods between the clock signals.

In another preferred embodiment, there is specifically provided a method for controlling upsets in an integrated circuit device comprising providing a current starved delay circuit to control voltage supply, receiving data from circuitry and redundantly sampling the data at time-shifted sampling periods, wherein each of the periods exceeds a duration of a pulse width of a single event upset; wherein an increase in the control voltage decreases the periods between the time-shifted sampling periods, and a decrease in the control voltage increases the periods between the time-shifted sampling periods.

In another preferred embodiment, there is specifically provided a method as recited above further comprising the step of selecting a majority from the samples taken from the data.

In another preferred embodiment, there is specifically provided a radiation hardened structured ASIC for very high speed System on a Chip (SoC) and Complex Digital Logic Systems, wherein the ASIC has a (data latch) circuit structure includes two delay elements, the first delay element is set to DT while the second delay element is set to 2*DT, a voter circuit votes between the original signal, the signal delayed by DT and the signal delayed by 2*DT, this filters transients due to multiple node strikes resulting in SEU immunity, wherein the delay is implemented using a current starved delay circuit, wherein the current starved delay circuit is controlled by a control voltage, wherein as the control voltage is increased the delay decreases, wherein the delay is dependent on supply voltage and temperature, and wherein the delay varies over voltage and temperature and process variations.

In another preferred embodiment, there is specifically provided a radiation hardened structured ASIC as above wherein the delay DT is 1-5 nanoseconds for 90 nm Bulk CMOS.

In another preferred embodiment, there is specifically provided a radiation hardened structured ASIC as above wherein the delay DT is less than 200 ps for 45 nm SOI CMOS.

DETAILED DESCRIPTION OF THE INVENTION

Radiation Hardened Application Specific Integrated Circuits (ASICs) provide the highest performance, lowest power and smallest size ICs for Space Missions. To dramatically reduce the development cycle, and reduce cost to tape out, provided herein is a Structured ASIC approach. In this methodology, an array of complex logic cells is fixed and a fixed area array is provided for 110 pads supporting in excess of 400 Complementary Metal-Oxide Semiconductor (CMOS) General Purposes Input/Output (GPIO) pins. In addition, the power grid is fixed as is the pins associated with power (core and 110) and ground. Thus, only routing in a subset of the metal layers is required to configure the Structured ASIC for a specific design. This leads to substantial reduction in design and verification time to tape out. Costs are reduced by requiring a subset of mask changes per design.

The invention is built on 90 nm silicon-proven Radiation Hardened Structured ASIC platform, and a Structured ASIC platform at the 45 nm SOI technology node is developed. The objective is to increase clock speeds to hundreds of MHz.

Single Event Upset (SEU) immunity is achieved in the sequential logic using Temporal Latch Technology. Also provided is a turnkey Register Transfer Language (RTL) to GDSII capability for Radiation Hardened ASICs.

ASICs have to be qualified to perform at the worst case temperature and voltage conditions. This results in a lower clock and lower overall performance. On the other hand, if the supply voltage increases and/or the temperature decreases, this will cause the delays in the Temporal Latch to decrease. This may result in SEU since the Single Event Transient may not be filtered. The delays are selected based on the technology node. Therefore, it is desirable to ensure that the delays remain stable over temperature and voltage and close to the design delay for a particular technology node. This is achieved with appropriate temperature and voltage compensation techniques in this invention.

In existing Temporal Latch based Single Event Upset (SEU) immune sequential logic, as temperature increase and/or supply voltage decrease, the delay in the Temporal Latch increases. This leads to increased setup time in the flip flop which in turn reduces the design clock frequency.

The invention provides SEU mitigation by temporal sampling to achieve both spatial and time redundancy while varying the temporal parameter using a current starved delay circuit. The circuit structure includes two delay elements. The first delay element is set to DT while the second delay element is set to 2*DT. A voter circuit votes between the original signal, the signal delayed by DT and the signal delayed by 2*DT. This combination in a data latch results in the filtering of transients due to multiple node strikes resulting in SEU immunity in a latch. The delay DT is chosen based on a particular technology node. For example at 90 nm Bulk CMOS it may be a few nanoseconds. At 45 nm SOI CMOS it is less than 200 ps. To save area, the delay may be implemented using a current starved delay circuit. In this circuit the delay can be controlled by a control voltage. As the voltage is increased the delay decreases. The delay is dependent on supply voltage and temperature. Therefore, the delay varies over voltage and temperature and due to process variations. To use the voting technique with a voltage and temperature controlled delay in an ASIC, the worst case in low voltage, high temperature and process variation is taken into consideration. Without varying the delay results in a large delay specification which results in substantial deterioration of maximum clock frequency in sequential logic. On the other hand, when the delay is compensated such that it is stable over voltage, temperature and process variation, then the design frequency can be met at the maximum frequency required for SEU mitigation at the particular technology node.

The current starved delay circuit stabilizes the oscillation frequency over voltage, temperature and process variation. This achieves a high design clock frequency for Systems on a Chip and Digital Signal Processing circuits using voting delay technology to mitigate SEU.

Unique Features

The novel technique is to compensate the variation in delay in current starved delay elements used in multiple redundant temporal voting latch technology to mitigate SEU in harsh radiation environments. The innovation results in high frequency clock operation in sequential circuits over temperature, voltage and process variations. This is especially important is Space-borne applications where extreme temperature variations occur. It is also very important due to the large process variations encountered as the technology node is scaled down.

Commercial Applications

Using the compensation technique for multiple redundant temporal voting latch technology, the current clock speed limitation in ASICs at 90 nm bulk CMOS can be stabilized at 200 MHz. Without this technique the worst case clock drops to 30-40 MHz. With this improvement, in structured ASIC performance at 90 nm, we can deploy radiation hardened digital sequential logic that mitigates SEU and operates up to 200 MHz. This opens up a large market in space-borne electronics especially replacing soft components-off-the-shelf (COTS) Systems on a Chip with low cost high performance SEU immune ASICs at the 90 nm CMOS technology node. This is important since this technology has been proven out in silicon. The new innovation will result in substantial increase in clock performance. The method can also be used in radiation hardened Structured ASIC at 45 nm SOI and other nodes to provide very high frequency operation to Systems on a Chip designs that mitigate SEU.

Potential NASA Commercial Applications

With the rapid development cycle to manufacture packaged Radiation Hardened ASIC chips with the increased speed performance and dramatically lower power, NASA can enable interplanetary and long term low Earth orbit missions that support 32 bit and 64 bit System on a Chip (SoC) with high speed networking and multiple sensor bus support. These SoC ASICs will enable more complex sensor integration with Command and Data Handling (C&DH). Designs can be adapted to various bus protocols proposed and in use for CubeSat missions. The reconfigurable high gate count, multi-MHz SEU immune sequential logic, embedded RAM and mask programmable Read Only Memory (ROM) capability, allows for high performance processors to be designed to meet mission requirements in rapid production cycles with proven in silicon fabric and standard die 110 and robust high pin count packaging. The anticipated six month to silicon cycle will allow NASA the ability to meet mission schedules without sacrificing speed and power requirements and will also enable missions that were otherwise impossible to achieve in harsh radiation environments.

Potential Non-NASA Commercial Applications

Commercial companies that deploy geosynchronous satellites will benefit from the capability to design Radiation Hardened ASICs that can be configured in a rapid production cycle to meet specific demands for interfacing to communication systems over high band width busses. The dramatic cost reduction with Structured ASIC will make possible missions that required ASICs but were cost prohibitive. The Rad Hard Structured ASIC approach will also allow commercial CubeSat missions to extend beyond low Earth orbit to interplanetary missions that require greater Total Ionizing Dose (TID) and SEU immunity. Also commercial missions with high cost payloads can plan longer term low Earth orbit missions using Rad Hard, high performance, low cost ASICs in place of Commercial Off The Shelf (COTS) parts that will fail.

General IC Circuitry

Figure 1:
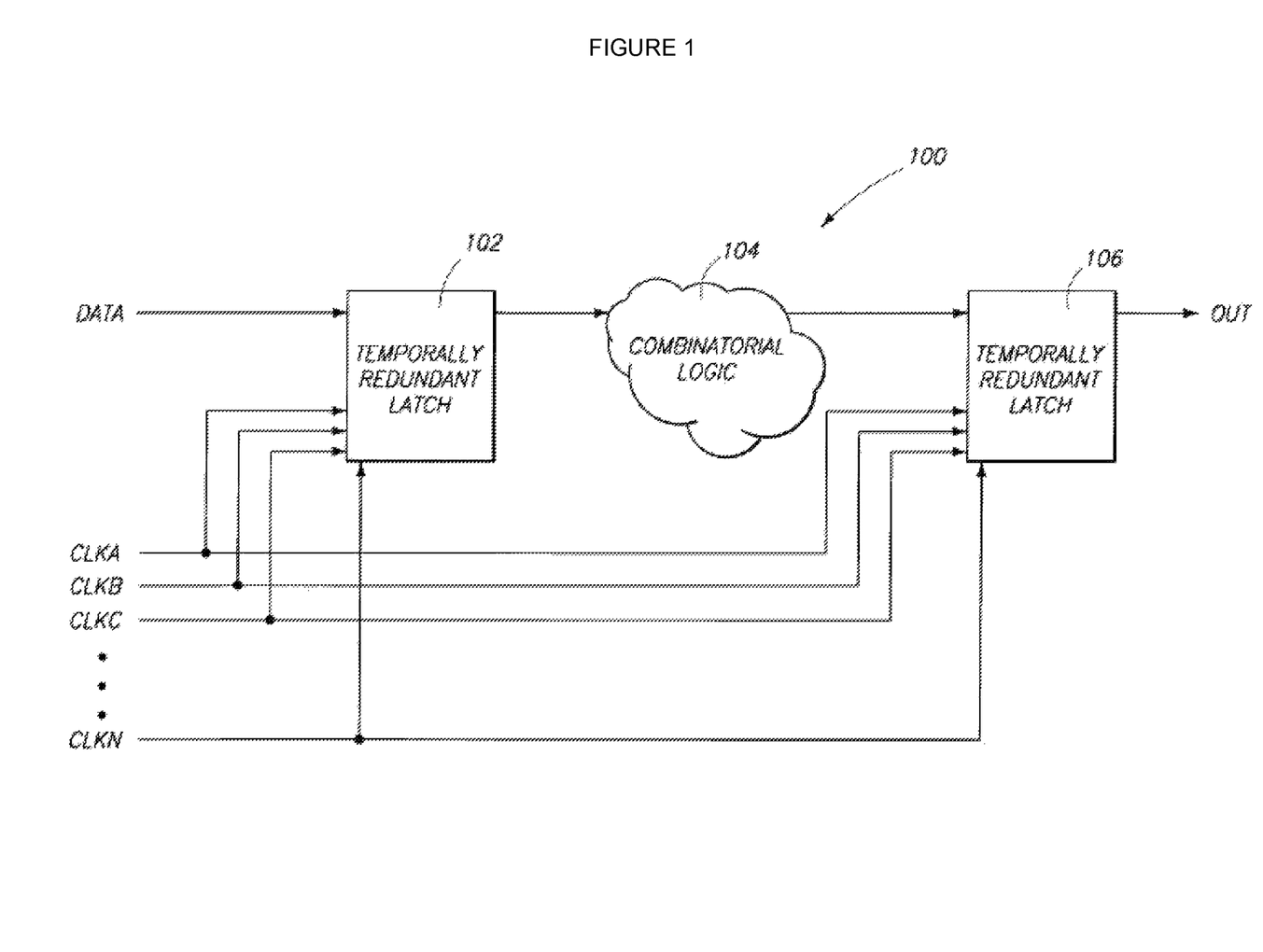
FIG. 1 is a block diagram of a sequential circuit constructed with temporal sampling latches according to an aspect of this invention.

FIG. 1 shows a sequential circuit 100 implemented as an integrated circuit (IC) device. The sequential circuit has a first temporally redundant latch 102, combinatorial logic block 104, and a second temporally redundant latch 106. Data output by the first latch 102 is passed through the combinatorial logic block 104, where the data is manipulated and changed as a result of the logic operations. The data output by the logic block 104 is then latched into the second latch 106.

The latches 102 and 106 are temporally redundant in that each latch takes multiple, time-spaced samples of the same data input at different and distinct "sampling" times as clocked by different clock signals CLKA, CLKB, . . . , CLKN. The latch 102, 106 then votes on the samples at another "voting" or "release" time, which is again different than the "sampling" times. The latch finds the majority of the samples for use as the output data. Through the multiple time-spaced samples, the latch accounts for every possible SET and SEU that might upset the circuit 100 at any time, as is explained below in more detail.

Temporally Redundant Latch

Figure 2:
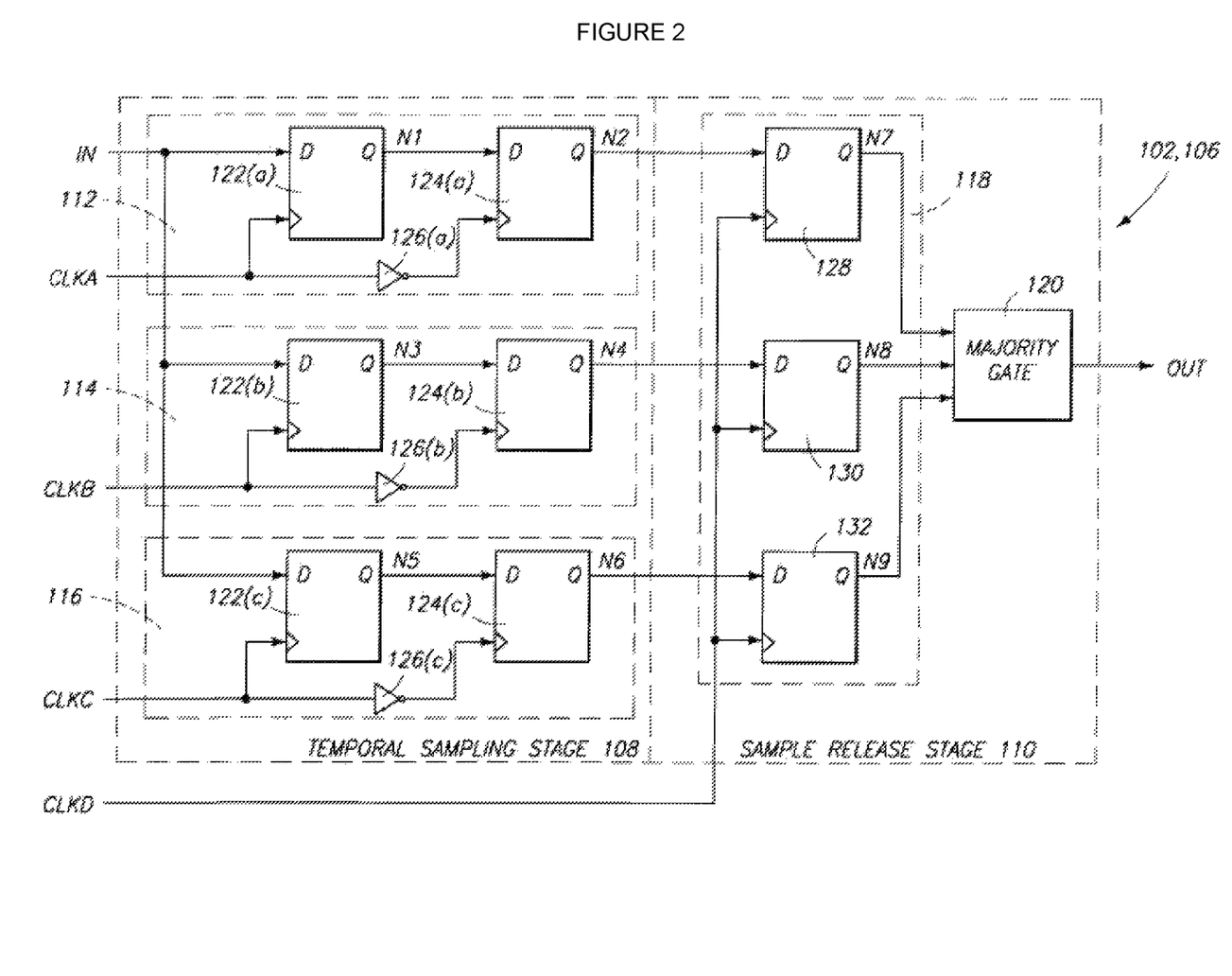
FIG. 2 is a block diagram of a temporally redundant latch employed in the sequential circuit.

FIG. 2 shows the temporally redundant latch 102, 106 in more detail. It contains a temporal sampling stage 108 and a sample release stage 110. The temporal sampling stage 108 contains multiple sampling systems to sample data at input IN at different sampling times. In this example, there are three sampling systems 112-116 operating in parallel. The sample release stage 110 contains a vote timing system 118 to collect the samples at the voting time and a majority system 120 to select a majority of the samples gathered by the vote timing system 118.

Each sampling system 112, 114, and 116 contains an edge triggered D flip-flop, which is formed by two level sensitive latches 122 and 124 arranged in tandem and clocked by complementary clock signals as a result of an inverter 126. Each level sensitive latch 122, 124 is transparent (i.e., sample mode) when its clock input is high and is blocking (i.e., hold mode) when its clock input is low. When in sample mode, data appearing at the input D also appears at the output Q. When in hold mode, the data stored within the latch appears at the output Q and any data changes at the input D are blocked. With the clock inversions, the D flip-flops 112-116 are triggered on the falling edges of corresponding clock signals CLKA, CLKB, and CLKC, respectively. For clarity, the level sensitive latches 122 and 124 are labeled in the format "122(A)" to mean the first latch 122 clocked by the clock signal CLKA.

The complement of each clock is formed locally by the inverters 126. This eliminates the need for routing global complimentary clock signals over the chip. Heavy ion induced transients on the clocks does not affect the SEU immunity of the temporally redundant latch.

The vote timing system 118 contains three level sensitive latches 128, 130, and 132 that are clocked by a fourth clock signal CLKD. The latches 128, 130, and 132 are associated with, and receive data output from, corresponding D flip-flop sampling systems 112, 114, and 116, respectively. The output of latches 128-132 of the vote timing system 118 are connected to the majority system 120, which is implemented as a majority gate. The majority system 120 selects a majority of the samples gathered by the vote timing system 118. That is, the majority system 120 selects the binary value stored by at least two of the three latches 128-132.

The temporally redundant latch 102, 106 is immune to upsets as a consequence of two distinct parallelisms: (1) a spatial parallelism resulting from the multiple parallel sampling systems, and (2) a temporal parallelism resulting from the unique clocking scheme involving multiple time-spaced clock signals. Previous redundant systems have used only spatial parallelism to achieve SEU immunity to cosmic ray strikes in static latches (inherently spatial). Immunity to SETs in combinatorial logic and global clock lines (inherently temporal) cannot be achieved with spatial redundancy alone, but is achieved the by temporal redundancy afforded by the latch 102, 106.

Figure 6:
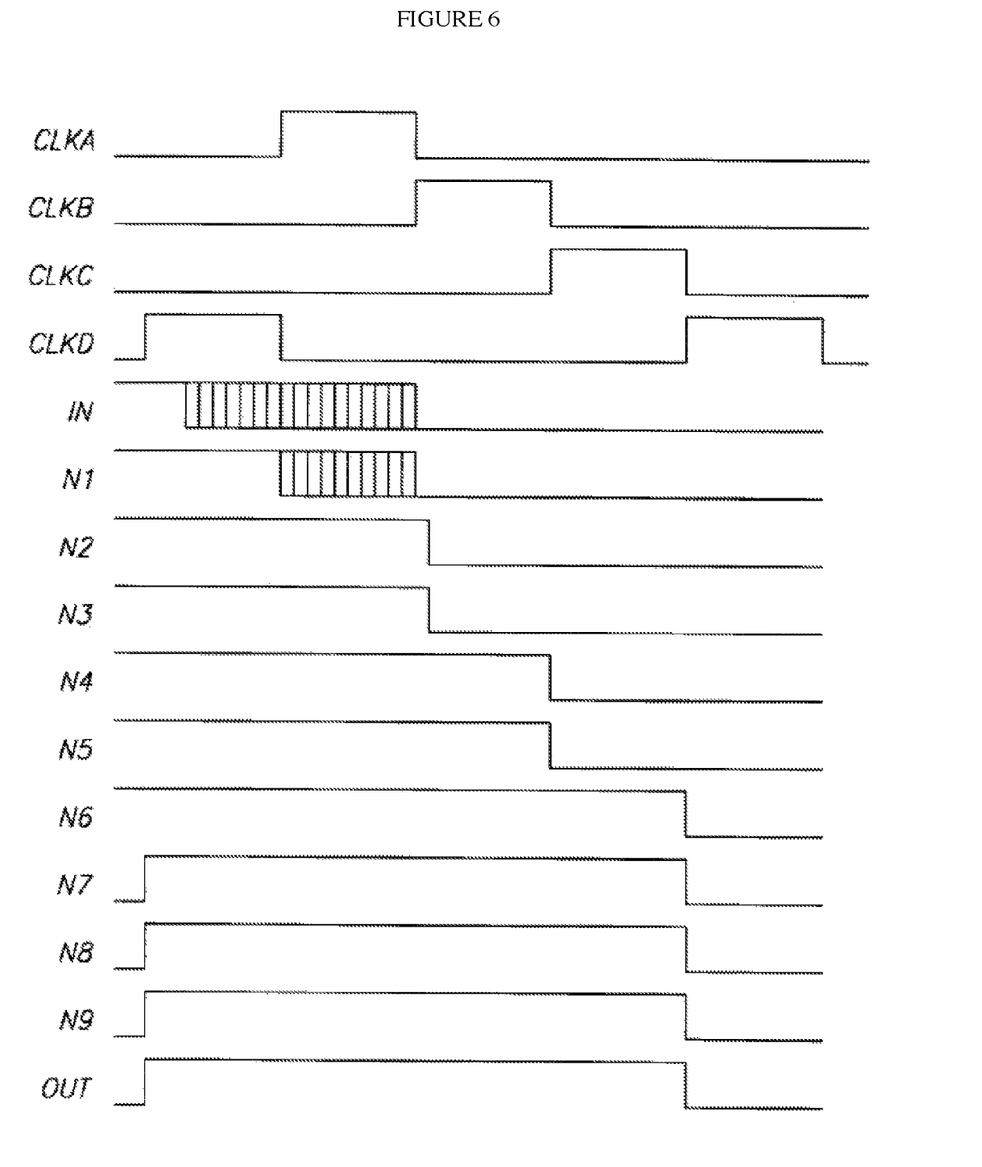
FIG. 6 is a timing diagram illustrating the operation of the temporally redundant latch in ne computational cycle.

One advantage of this temporally redundant latch is that the entire combinatorial logic 104, which forms the bulk of the sequential circuit, is not replicated multiple times to form a completely spatially redundant circuit. Instead, the combinatorial logic 104 is effectively replicated in time, rather than in space. In the FIG. 6 implementation, the same combinatorial logic 104 is used at three different times. The result is that errors are flushed on each clock cycle and the maximum error latency never exceeds a clock period.

Clocking Scheme

Temporal redundancy in the circuit 100 is achieved by combining a temporal sampling stage 108 with a sample release stage 110 where the sampling is controlled by multiple time-spaced sampling clock signals (i.e., CLKA, CLKB, and CLKC) and the release is invoked by a different voting or release clock signal CLKD.

Figure 3:
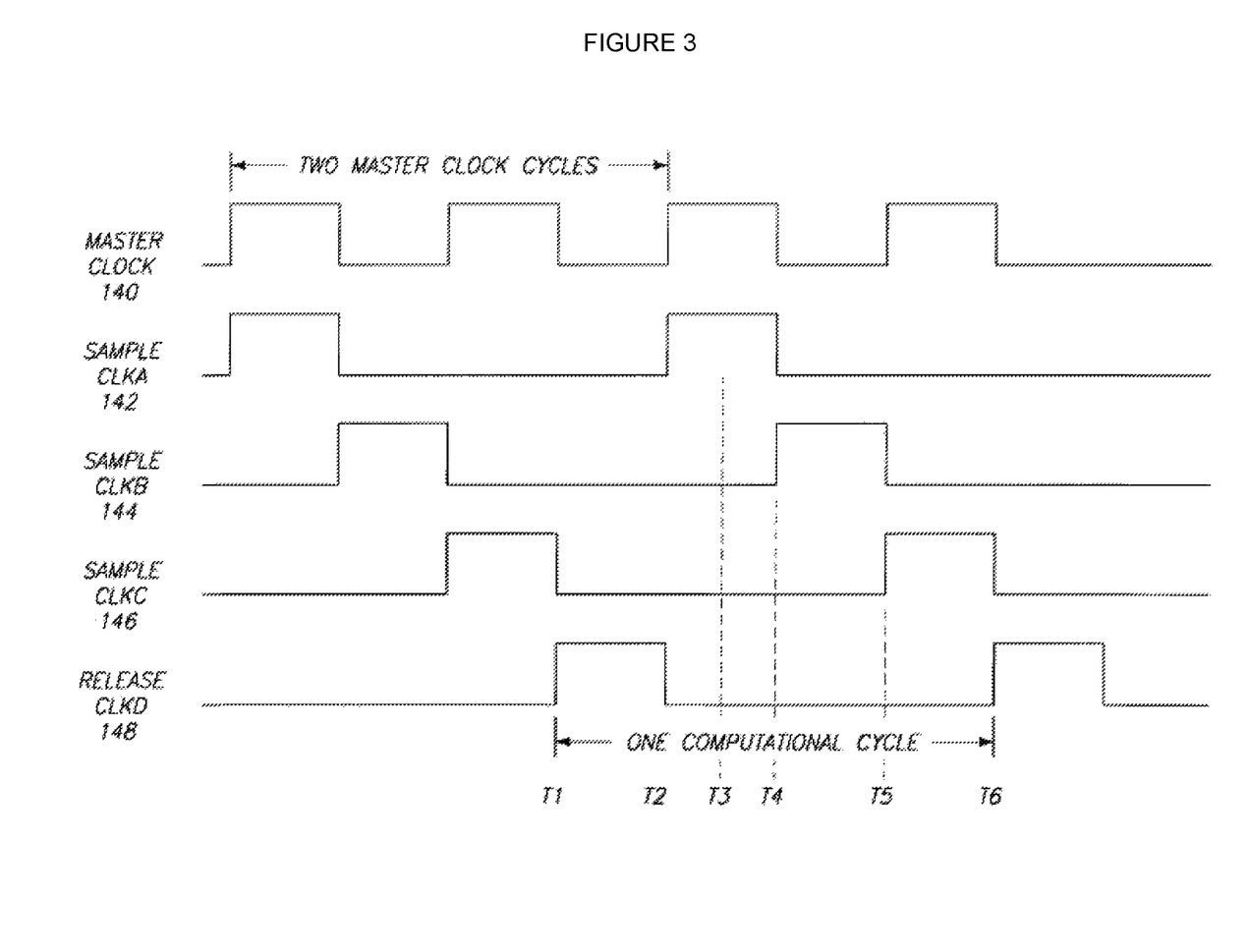
FIG. 3 is a timing diagram of multiple clock signals used to drive the temporally redundant latch of FIG. 7.

FIG. 3 shows the clocking scheme used to drive the sequential circuit 100. In the illustrated embodiment, there is a single master clock signal 140, from which the sampling and release clock signals are derived. Four cycles of the master clock signal 140 are shown. The master clock would generally be the clock signal brought onto the chip through an input pad. It could also be a higher frequency clock generated on chip with a clock multiplier synchronized to the input clock through a phase locked loop.

The three sampling clock signals CLKA 142, CLKB 144, and CLKC 146, as well as the release clock signal CLKD 148, are derived from the master clock signal 140. It is these four signals that are used in the sequential circuit 100.

FIG. 3 shows two cycles of the temporal sampling and release clock signals. Each of the four clocks 142-148 operates at a 25% duty factor and each is in phase with the master clock 140. CLKA is high during the first half of cycle one of the master clock. CLKB is high during the second half of cycle one of the master clock. CLKC and CLKD are high during the first and second halves, respectively, of cycle two of the master clock. Thus, a full cycle of clocks CLKA, CLKB, CLKC, and CLKD occupies two cycles of the master clock. Controlling the fidelity of the four clocks is not a problem because the temporal sampling latch operates correctly even in the presence of skew or overlaps.

In the temporally redundant latch, data is released to the combinatorial logic 104 on the rising edge of sampling clock CLKD and reaches the next latch before the falling edge of sampling clock CLKA (minus the setup time). In FIG. 3, this duration represents the period of the master clock minus the D flip-flop setup time. A conventional circuit that satisfies the timing constraints for the master clock likewise satisfies the timing constraints of this clocking scheme.

The two extra sampling clock signals CLKB and CLKC enables the additional time-spaced sampling. The clock signals occupy one additional master clock period. As a result, the effective on-chip computational frequency is exactly one-half the frequency of the master clock provided from off-chip. Therefore, a factor of two speed penalty is incurred to ensure upset immunity.

It is noted that in other implementations the widths of the extra sampling clock signals CLKB and CLKC can be made smaller. The widths need only be greater than the maximum width of any SET induced in the combinatorial logic 104. As an example, a system might provide a master clock signal that has a frequency of 50 MHz. Clock signals CLKA and CLKD would therefore each have widths of 10 ns. The other two clock signals CLKB and CLKC, however, could each be as narrow as 500 ps (0.5 ns) and still reject the SETs produced in the combinatorial logic. This results in an effective on-chip clock period of 21.0 ns corresponding to a frequency of 47.6 MHz. In this case only a minor speed penalty (4.8%) is incurred by using the temporal sampling latches. If the clock signals CLKB and CLKC are kept at 500 ps as the master clock frequency is increased, the speed penalty approaches its maximum value of two times the master clock frequency.

The clocking scheme of FIG. 3, with equal size clock pulse widths, is more preferred because it is simple to generate and because an effective on-chip frequency exactly one-half the master clock frequency is easier to synchronize to other signals at the board level. Also, if the sampling clocks CLKB and CLKC have widths that are too small compared to the widths of clocks CLKA and CLKD, second order errors, such as multiple strikes in the combinatorial logic, can conceivably occur.

Clock Generation

Figure 4:
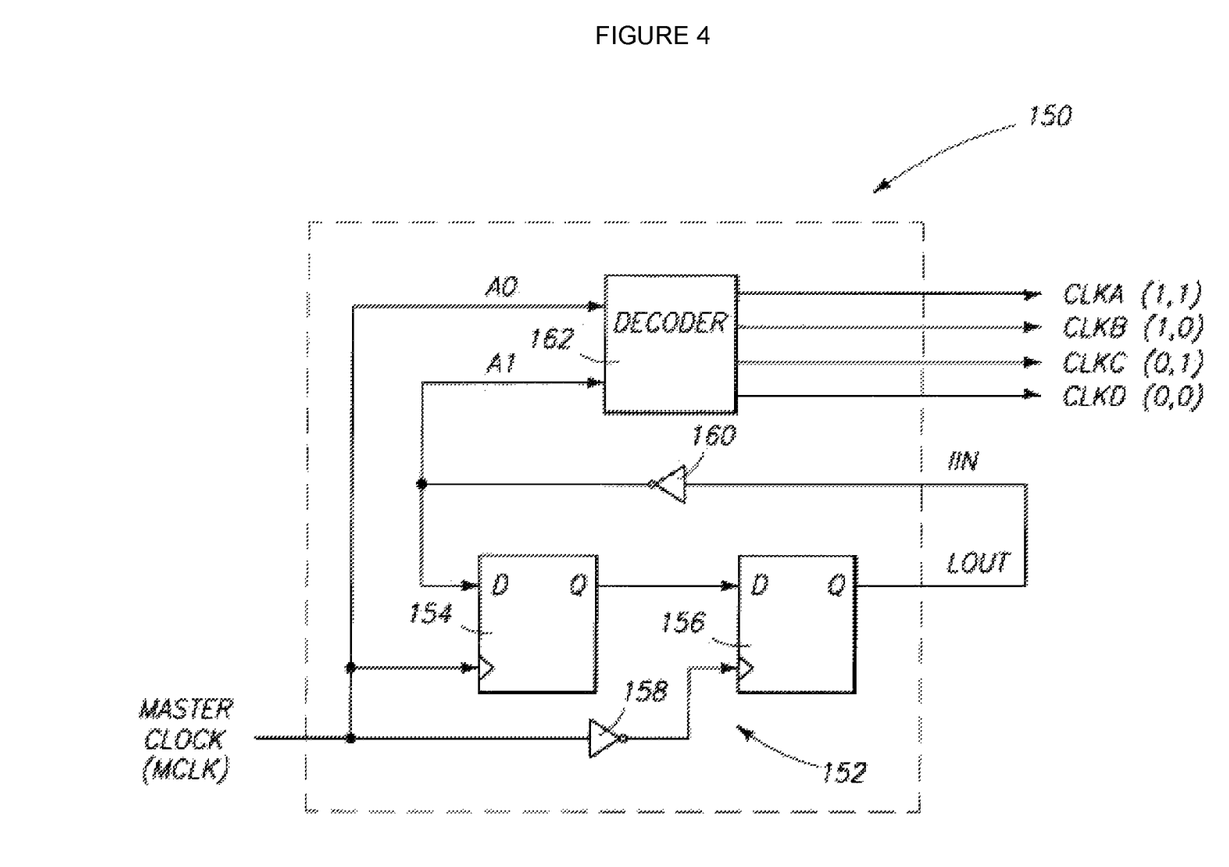
FIG. 4 is a block diagram of a non-redundant clock generating circuit that generates the multiple clock signals.

FIG. 4 shows one embodiment of a clock generating circuit 150 used to generate the four clock signals CLKA, CLKB, CLKC, and CLKD. The master clock (MCLK) is brought on chip through a pad buffer. The clock generating circuit 150 has a D flip-flop 152 formed by level sensitive latches 154 and 156 and an inverter 158. The master clock MCLK is input to the first latch 154 of the D flip-flop 152 and the compliment of the master clock is input to the second latch 156 via the inverter 158.

The output of the latch 156 (LOUT) is fed back to the input of latch 154, via an inverter 160. In this embodiment, the input to the inverter 160 (IIN) is the same as the latch output (LOUT). In another embodiment described below with reference to FIG. 5, this is not the case.

The D flip-flop 152 and feedback inverter 160 perform a divide-by-two operation on the master clock MCLK, generating a new clock signal of one-half the frequency. Latches 154 and 156 are provided with power up reset circuitry (not shown) to initialize the sequence.

The clock generating circuit 150 also includes a decoder 162 that decodes the master and half frequency clock signals into the four clock signals CLKA, CLKB, CLKC, and CLKD. The master clock and the half frequency clock signals form addresses for the decoder 162. Address bit 0 (A0) is taken from the master clock and address bit 1 (A1) is taken from the half frequency clock. The decoder 162 generates a high on only one of the four outputs according the address (A1,A0). As shown in FIG. 9, the decoder toggles the output lines in the following address order (1,1), (1,0), (0,1), and (0,0). These output lines are selected, in this order, to provide the four clock signals CLKA, CLKB, CLKC, and CLKD.

The clock generating circuit 150 is itself susceptible to upsets. In particular, an SEU in one of the level sensitive latches might cause the on-chip control clocks to get out of phase with the master clock. To avoid this upset, another clock generating circuit that is immune to upset may be used.

Figure 5:
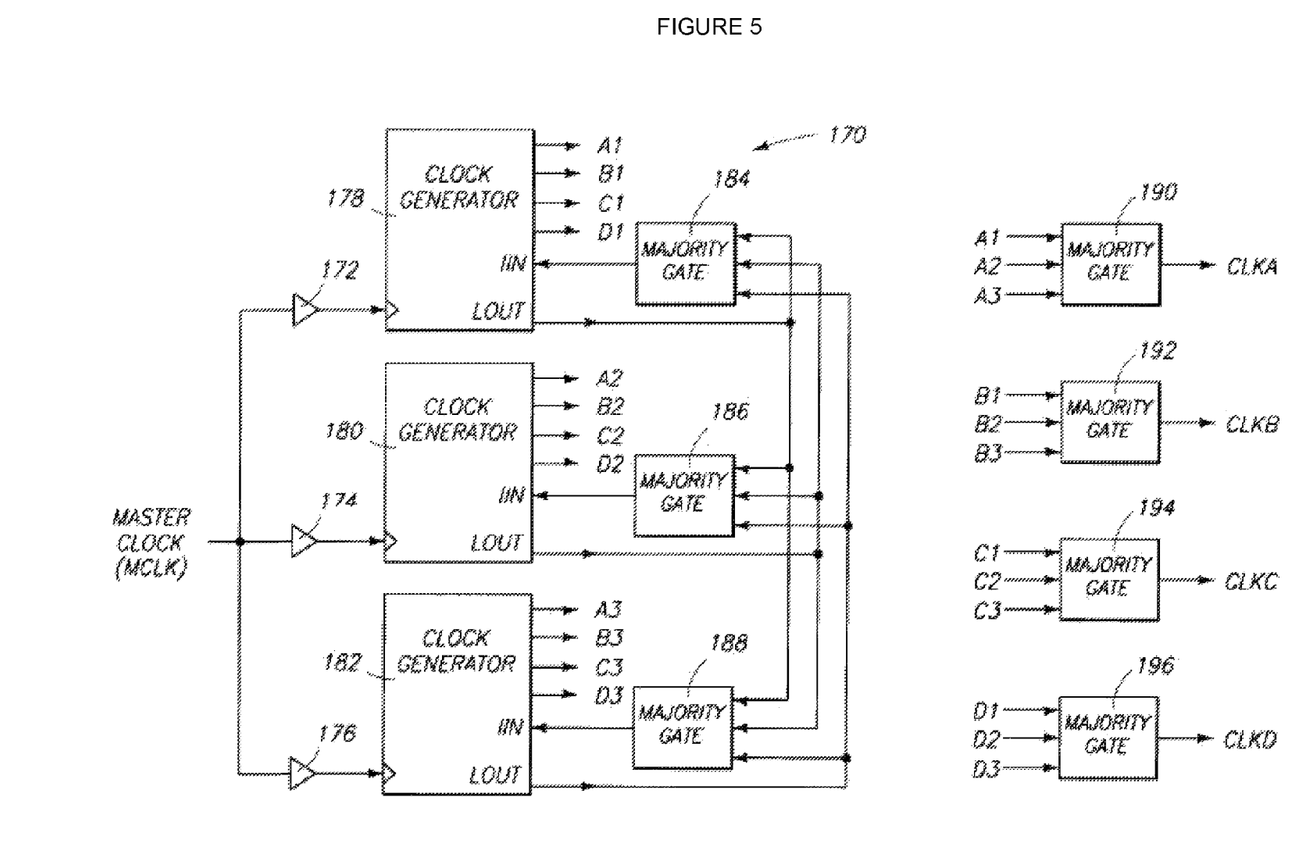
FIG. 5 is a block diagram of a redundant clock generating circuit that generates the multiple clock signals.

FIG. 5 illustrates a second embodiment of a clock generating circuit 170 that is immune to SEUs. The master clock MCLK is brought onto the chip through a pad driver cell that immediately breaks the signal into three independent paths through three independent buffers 172, 174, and 176. In this way, there exists no single node for which a cosmic ray strike can simultaneously affect more than one master clock input of the subsequent generator circuits.

The clock generating circuit 170 has three clock generators 178, 180, and 182 arranged in parallel to receive the three versions of the master clock signal. Each clock generator contains the circuitry 150 shown within the dashed box of FIG. 4. (Note that in FIG. 4 the dashed box breaks the wire connecting the latch output to the inverter input.) In FIG. 5, each of the three latch outputs LOUT are fed to three majority gates 184, 186, and 188 and the majority gate outputs are fed back to the three inverter inputs IIN within the clock generators 178, 180, and 182.

The clock generating circuit 170 also has four additional majority gates 190, 192, 194, and 196 that are coupled to receive outputs A1-A3, B1-B3, C1-C3, and D1-D3 from the clock generators 178-182, respectively. The four majority gates 190-196 generate the final clocks CLKA, CLKB, CLKC, and CLKD from the three generator outputs.

With this arrangement, each of the three parallel clock generators 178-182 provides a full complement of on-chip control clocks. The resulting circuit can no longer get out of phase with the master clock. Furthermore, any internal erroneous latch values are purged within two master clock cycles. A cosmic ray strike on one of the internal nodes in any of the final majority gates can produce a SET on a clock line. These SETs do not affect the operation of the temporal sampling latches, as is explained below in more detail.

Current Starved Circuit

Figure 7:
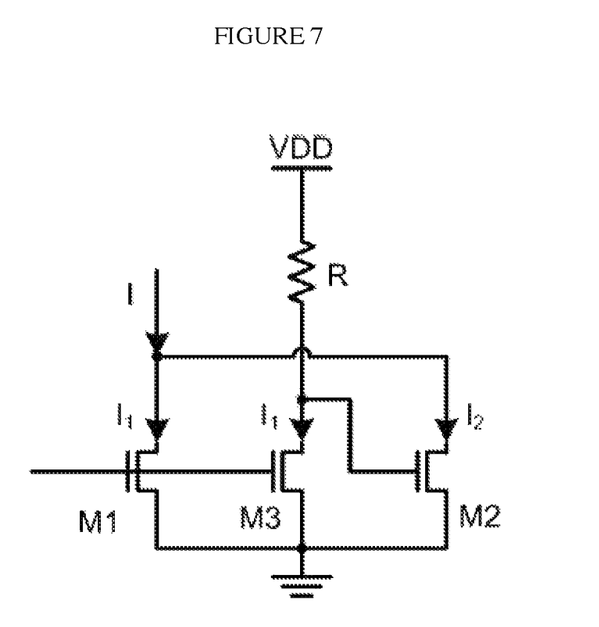
FIG. 7 is a schematic of an addition-based current source.
Figure 8:
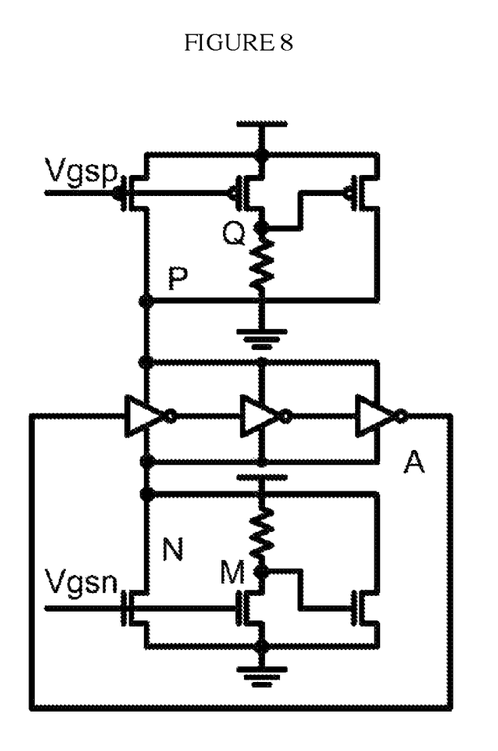
FIG. 8 is a schematic of an addition-based ring oscillator.

Referring now to FIGS. 7 and 8, the addition of the current starved circuit allows the present invention to compensate for detected variations. Although primarily directed to variations caused by space-based radiation upsets, circuit fabrication process variations are also contemplated herein as part of the inventive subject matter. Major sources that contribute to device level random offsets in deep-submicron fabrication are mismatch in device geometry caused by lithographic limits; differences in doping, diffusion depth, and ion implantation; and electrical environment variations related to large-scale nonuniformities and pattern density in the process. Apart from the fabrication process, thermal gradients and mechanical stresses can also induce variation in the circuit.

Circuit Implementation

In this section, a low variation addition-based current source is presented as the bias current source. A process-invariant addition-based current source is chosen as the bias current source, because it has the same loading effect as a single transistor driving the same amount of current. The circuit schematic of the addition based current source is shown in FIG. 7.

M1 and M3 are two NFETs with the same width and length designed via a common centroid layout to obtain good local matching, so that the drain currents in both transistors will change in the same way when process conditions change. The operation of the circuit can be intuitively explained: if increases due to process variation, the gate voltage of M2 will be pulled down, resulting in a lower drain current; similarly, if decreases, the gate voltage of M2 goes up and gets higher. In both cases, the net result is a stable output current I—the sum of and—which is relatively unchanged by the process condition.

It is expected that a simulation that uses IBM's 90 nm process model can result in an addition-based current source that delivers a two-thirds or greater reduction in the normalized standard deviation of its output current compared to the baseline single transistor.

The general methodology does not distinguish the sources of variation when calculating the variation term. In fact, variation caused by changes in the temperature is also compensated by the same topology, because the critical parameters that vary with temperature—the mobility of the charge carriers, the threshold voltages, and the resistance (R) are the same variables in assumptions when dealing with process variation.

Referring now to FIG. 8, the circuit schematic shows a current-starved ring oscillator after replacing the single transistor. The current provided by the top PFET current source is designed to match that of the bottom NFET current source. The effective load capacitance looking into the current source is on the order of hundreds of pF (effective capacitance values), setting the start-up time around 100 ps. There is only minimal additional phase noise contribution from the addition-based current source. For controlling voltage variation, the oscillator can be configured to supply voltage Vdd variation. If a resistive or capacitive divider is used to generate the gate bias voltage for the addition-based current sources from Vdd, it is expected that for a 20% variation from 0.9 V to 1.1 V, the frequency will varies by less than 0.35%, or a line regulation of 1.75%/V. For applications that require more stringent line regulation, a bandgap reference, LDO, or other voltage regulating technique is integrated with the oscillator, as the flexibility of the design does not preclude use of additional compensation methods. Further, in applications where frequency tuning is desired, such as in a PLL, the addition-based current source can be used as the offset current bias to establish a stable offset frequency. Additional voltage controlled or digitally-controlled current arrays can then be connected in parallel with the offset current bias to achieve frequency tunability.

Circuit Operation

The operation of the sequential circuit 100 (FIG. 1) will now be described with reference to the clocking scheme shown in FIG. 3. For simplicity, all events are referenced relative to clock edges without regard to setup and hold times. When it is stated that a signal arrives somewhere before a clock edge, the reader is assumed to understand that the signal really arrives a setup time earlier than the clock edge. When it is stated that a signal appears at an output after a clock edge, the reader is assumed to understand that the signal appears after a time equal to the clock-to-output time.

The computational cycle begins at the rising edge of release clock CLKD, at time T1 in FIG. 3. At this time the sample release latches 128, 130, and 132 of the vote timing system 118 pass their input data to the majority system 120. The majority system 120 outputs the majority value from among the three latches. When release clock CLKD subsequently goes low (time T2), the release latches 128-132 enter a hold state and the original data remains asserted on the output for the remainder of the computational cycle.

The output of the majority system 120 is processed by intervening combinatorial logic 104 before it appears at the input to the next temporally redundant latch 106, as shown in FIG. 1. The data arrives at the input to the latch 106 sometime before the falling edge of sampling CLKA, at say time T3. At the falling edge of sampling clock CLKA (time T4), the data is stored in the first sampling system 112 formed by latches 122(A) and 124(A).

Concurrent with the falling edge of clock CLKA (time T4), the second sampling clock CLKB goes high to sample the input. When sampling clock CLKB goes back low (time T5), the data at the input of the latch is stored in the second sampling system 114 formed by latches 122(B) and 124(B). In the same way, the third sampling clock CLKC toggles high and low to sample and hold the input data at time T6 in the third sampling system 116 formed by latches 122(C) and 124(C).

At time T6 after the three sampling clock signals, another computational cycle begins. The input data to each temporal sampling system 112-116 has been asserted on the corresponding three inputs to the latches 128-132 of the vote timing system 118. When this next computational cycle begins at time T6, the release clock CLKD again goes high and the data is passed to the majority system 120 and a majority value is passed to the output of the latch 106.

FIG. 8 illustrates the voltage values on each node N1-N9 in the temporally redundant latch for a complete computational cycle. It shows how each node voltage is correlated to the clock signals for a temporal sampling latch whose input is high at the start of a computational cycle and goes low before the falling edge of CLKA.

Upset Immunity

The temporally redundant latches 102, 106 eliminate upsets in the sequential circuit 100. As noted above, upsets are avoided as a result of the spatial parallelism provided by the three D flip-flop sampling branches and the temporal parallelism provided by the multiple clock signals and the sampling and release architecture of the design.

Upset immunity is easiest described in terms of four distinct upset mechanisms: (1) static latch SEU, (2) data SET, (3) sampling clocks SET, and (4) release clock SET. The static latch SEU is the upset mechanism of primary concern in present day spaceborne microelectronics systems fabricated in 0.8 micron to 0.7 micron feature sizes. The other three upset mechanisms will be of concern in future systems fabricated in 0.35 micron and smaller feature sizes.

Case 1: Static Latch SEU

Static latch SEU occurs when a cosmic ray flips the data state of a latch whose clock is low and is in a blocking state (i.e., hold mode). Any such single upset in any of the nine latches in FIG. 2 will only affect one of the three parallel data paths through the circuit. When data release occurs, one of the three nodes N7, N8, or N9 from the vote timing system 118 will be in error while the other two will be correct. The majority gate 120 correctly selects the data correctly asserted on the two latches to ensure that the correct data value is asserted on the output node. Such a data flip can occur at any time within the computational cycle and not affect the output value.

Case 2: Data Set

Data SET occurs when a cosmic ray strikes a node in the combinatorial logic 104 preceding the temporally redundant latch 106 and the resulting transient propagates to the input of the latch 106 as a normal signal. The transient is latched into only one of the three parallel sampling systems 112, 114, and 116 if it arrives on a falling edge of one of the three sampling clock signals CLKA, CLKB, or CLKC. As a result, only one of the three parallel data paths is corrupted, while the other two remain correct. When data release occurs, the majority gate 120 again ensures that the correct data appears at the output node.

Case 3: Sampling Clocks Set

Cosmic ray strikes on nodes in the clock generation circuitry or in the clock distribution tree will produce SETs on the clock signal lines that can cause the latches to toggle data at unintended times. The three sampling clocks CLKA, CLKB, and CLKC are used symmetrically and can be discussed together. Remember that the controlled latch pairs 122 and 124 form a falling edge triggered D flip-flop. At falling clock edges, the D flip-flops store whatever data happens to be present at their inputs. If a clock is low, an SET will result in a rising edge followed by a falling edge. If a clock is high, an SET will produce a falling edge followed by a rising edge. In either case a data store occurs.

There are two time intervals in the computational cycle that may be affected by a sampling clock SET. The first interval starts at the rising edge of the release clock signal CLKD (beginning of a computational cycle) and ends when the released data arrives at the input to a subsequent temporally redundant latch 106. The second interval starts at this data arrival time and ends when the release clock signal CLKD again transitions high ((beginning of the next computational cycle).

If the SET induced falling edge on any of the sampling clocks CLKA, CLKB, or CLKC occurs in the first of these intervals, old data is stored in one of the three parallel sampling circuits 112-116. The true (intended) falling edge occurs later and the correct data will be sampled. The only exception is for CLKA, which may experience an SET that overlaps the true falling edge. This shifts the falling edge to an earlier time by an amount less than or equal to the SET pulse width. If this shift causes a setup time violation of the D flip-flop 112, old (incorrect) data may be stored in the first sampling circuit 112. As in the above cases, however, this results in only one of the three parallel paths being corrupted and the majority gate 120 once again produces correct data values at the output.

If the SET induced falling edge occurs in the second interval (i.e., from data arrival to clock CLKD), the only effect is to store the correct data. This SET may occur before the actual clock edge (in which case the correct sampling is performed early) or it may occur after the actual clock edge (in which case correct data is re-sampled). The SET may overlap the true clock edge in which case a single correct sampling is performed slightly early.

Case 4: Release Clock Set

The effects of an SET on the release clock CLKD are somewhat different than those on the sampling clocks CKKA, CLKB, and CLKC. Again, consider two distinct time intervals in the computational cycle: a first interval when CLKD is high and a second interval when CLKD is low. A negative transient when CLKD is high causes each of the sample release latches 128-132 to momentarily hold what was being sampled and then, when the clock restores, continue to sample what was being sampled in the first place. This event therefore has no effect on the operation of the circuit.

A positive SET when CLKD is low causes each of the sample release latches 128-132 to first sample its input (become transparent) and pass the value to the majority gate and then store (hold) this data value for the majority gate when the transient disappears. The effect of this positive transient depends on the current state of the sampling clocks CLKA, CLKB, and CLKC. If the positive SET occurs before the falling edge of sampling clock CLKA in the computational cycle, nodes N2, N4, and N6 from sampling circuits 112-116 still have their original values and the majority gate output will not change. If the positive SET occurs between the falling edge of sampling clock CLKA and the falling edge of sampling clock CLKB, node N2 may have changed but nodes N4 and N6 still have their original values and the majority gate will produce the correct output. Finally, if the positive SET occurs between the falling edge of sampling clock CLKB and the falling edge of sampling clock CLKC, both nodes N2 and N4 may have changed (to the next cycle values) and only node N6 will have its original value. In this case the majority gate output may change. However, this is simply a premature change to the next sample release value that would have eventually occurred anyway when CLKD was scheduled to rise. This premature data change could then get latched into the third sampling circuit 116 of a downstream temporally redundant latch if it arrives before the falling edge of sampling clock CLKC.

If the SET on the release clock CLKD is local to a single sampling latch, the majority gate of the downstream temporal sampling latch will suppress the erroneous value (just as it suppresses the Case (1) and Case (2) events discussed above) and the premature data release is confined to the single affected latch. If this transient is common to a group of sampling latches, all latches in the group will release prematurely. If the transient is global to the chip, such as would happen if the transient occurred in the clock generator, then all latches on the chip will prematurely release their data. In each case, nodes are simply assuming correct data values one quarter of a computational cycle early. All data values achieve correct synchronization at the start of the next computational cycle.

A benefit of the circuitry described above is that, for each of the four upset mechanisms, any erroneous data stored in any of the sampling latches is flushed within a single computational cycle. Any premature data releases get back in phase within one quarter of a computational cycle. Thus the latency of these erroneous values never exceeds one computational cycle.

For complete error elimination, the width of the SET is less than the width of any of the four clock pulses CLKA, CLKB, CLKC, and CLKD that control the latch circuitry. If the SET pulse width exceeds any of the clock pulse widths, the temporally redundant latch exhibits a non-zero error rate. For typical 100 ps to 200 ps SET pulse widths, the master clock frequency is limited to 2.50 GHz and limits the on-chip computational speed to 1.25 GHz.

REFERENCES

Mavis, Eaton, "Temporally Redundant Latch for Preventing Single Event Disruptions in Sequential Integrated Circuits", U.S. Pat. No. 6,127,864, Zhang, Xuan; Apsel, A. B., "A Low-Power, Process-and-Temperature-Compensated Ring Oscillator With Addition-Based Current Source," IEEE Transactions on Circuits and Systems, Volume: 58, Issue: 5

The invention(s) being claimed is:

1. A sequential circuit for implementation in an integrated circuit device comprising:
   (a) a stable output circuit for providing a process-invariant addition-based bias current source (I), the stable output circuit comprising:
      (i) a first n-channel field effect transistor (NFET) (M1) and a second n-channel field effect transistor (NFET) (M3), each of NFET M1 and NFET M3 having the same width and length and configured in a common centroid layout wherein drain current I1 of NFET M1 and drain current I1 of NFET M3 change in the same way when voltage and/or temperature process conditions change; and
      (ii) a third n-channel field effect transistor (NFET) (M2) having drain current I2, wherein NFET M2 is operatively connected to NFET M1 and NFET M3;
      wherein if drain current I1 increases due to process variation, gate voltage of M2 is pulled down resulting in lower drain current I2;
      wherein if drain current I1 decreases due to process variation, gate voltage of M2 is pulled up resulting in higher drain current I2; and
      wherein the sum of I1 and I2 always equals output current (I);
   (b) a clock generating circuit to generate first, second, third, and fourth clock signals from a master clock signal wherein periods between the clock signals exceed a duration of a pulse width of a single event upset;
   (c) a temporally redundant latch receiving output current (I) from the stable output circuit and connected to the clock generating circuit, the temporally redundant latch comprising:

(i) a first sampling circuit triggered by the first clock signal to sample input data at a first time;

(ii) a second sampling circuit triggered by the second clock signal to sample the input data at a second time;

(iii) a third sampling circuit triggered by the third clock signal to sample the input data at a third time; and (iv) a sample release circuit coupled to the first, second, and third sampling circuits and triggered by the fourth clock signal to output at a fourth time a majority of the samples collected by the first, second, and third sampling circuits;

wherein an increase in the control voltage decreases the periods between the clock signals, and a decrease in the control voltage increases the periods between the clock signals.

2. The sequential circuit of claim 1, wherein the master clock signal has a first frequency and the first, second, third, and fourth clock signals operate at a second frequency that is one-half the first frequency.

3. The sequential circuit of claim 1, wherein the first, second, third, and fourth clock signals are time shifted from one another.

4. The sequential circuit of claim 1, wherein each of the first, second, third, and fourth clock have a width greater than 200 ps.

5. The sequential circuit of claim 1, wherein the clock generating circuit comprises a latch to receive the master clock signal and a decoder to produce the first, second, third, and fourth clock signals from the master clock signal.

6. The sequential circuit of claim 1, wherein each of the sampling circuits is selected from the group consisting of a latch, a dual interlocked storage cell, and a D flip-flop.

7. The sequential circuit of claim 1, wherein the sample release circuit comprises:

a vote timing circuitry coupled to receive the samples taken by the first, second, and third sampling circuits at the fourth time; and a majority system to select a majority of the samples received by the vote timing circuitry.

8. The sequential circuit of claim 1, further comprising a mode selection circuit coupled to the clock generating circuit to enable a fast mode of operation in which the first, second, and third sampling circuits and the sample release circuit operate at a frequency of the master clock signal without upset immunity.

9. The sequential circuit of claim 1 embodied in a system selected from the group consisting of: a spaceborne microelectronics system, a satellite, a spacecraft, and an aircraft control system.

10. The sequential circuit of claim 1, deployed into a radiation hardened structured ASIC for very high speed System on a Chip (SoC) and Complex Digital Logic Systems, wherein the ASIC comprises one or more 32- or 64-bit processor cores (CPUs) interconnected with embedded RAM, a networking bus, a multiple sensor bus, reconfigurable SEU-immune sequential logic, and mask programmable Read Only Memory (ROM).

11. A method for controlling upsets in an integrated circuit device, comprising:

(1) providing a sequential circuit comprising:

(a) a stable output circuit for providing a process-invariant addition-based bias current source (I), the stable output circuit comprising:

(i) a first n-channel field effect transistor (NFET) (M1) and a second n-channel field effect transistor (NFET) (M3), each of NFET M1 and NFET M3 having the same width and length and configured in a common centroid layout wherein drain current I1 of NFET M1 and drain current I1 of NFET M3 change in the same way when voltage and/or temperature process conditions change; and (ii) a third n-channel field effect transistor (NFET) (M2) having drain current I2, wherein NFET M2 is operatively connected to NFET M1 and NFET M3;

wherein if drain current I1 increases due to process variation, gate voltage of M2 is pulled down resulting in lower drain current I2;

wherein if drain current I1 decreases due to process variation, gate voltage of M2 is pulled up resulting in higher drain current I2; and wherein the sum of I1 and I2 always equals output current (I);

(b) a clock generating circuit to generate first, second, third, and fourth clock signals from a master clock signal wherein periods between the clock signals exceed a duration of a pulse width of a single event upset;

(c) a temporally redundant latch receiving output current (I) from the stable output circuit and connected to the clock generating circuit, the temporally redundant latch comprising:

(i) a first sampling circuit triggered by the first clock signal to sample input data at a first time;

(ii) a second sampling circuit triggered by the second clock signal to sample the input data at a second time;

(iii) a third sampling circuit triggered by the third clock signal to sample the input data at a third time; and (iv) a sample release circuit coupled to the first, second, and third sampling circuits and triggered by the fourth clock signal to output at a fourth time a majority of the samples collected by the first, second, and third sampling circuits;

wherein an increase in the control voltage decreases the periods between the clock signals, and a decrease in the control voltage increases the periods between the clock signals;

(2) receiving data into the sequential circuit and sampling the data at multiple different times to produce multiple time-spaced samples that are spaced temporally longer than a pulse width of a single event upset;

(3) collecting the time-spaced samples at another time; and (4) selecting a majority from the time-spaced samples;

wherein an increase in the control voltage decreases the periods between the different times, and a decrease in the control voltage increases the periods between the different times.

12. The method of claim 11, further comprising the step of alternatively switching between a safe mode of operation in which data is sampled at multiple different times to produce multiple time-spaced samples that are spaced temporally longer than a pulse width of a single event upset and a fast mode of operation in which the data is sampled at times in which the time-spaced samples are temporally spaced so as not to exceed the pulse width of the single event upset.

* * * * *